United States Patent
Gardner et al.

(10) Patent No.: US 6,218,720 B1
(45) Date of Patent: Apr. 17, 2001

(54) SEMICONDUCTOR TOPOGRAPHY EMPLOYING A NITROGENATED SHALLOW TRENCH ISOLATION STRUCTURE

(75) Inventors: Mark I. Gardner, Cedar Creek; Dim-Lee Kwong; H. Jim Fulford, Jr., both of Austin, all of TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/176,131

(22) Filed: Oct. 21, 1998

(51) Int. Cl.$^7$ .................................................. H01L 29/00
(52) U.S. Cl. .................... 257/510; 257/501; 257/506; 257/508; 257/510; 257/513; 438/459
(58) Field of Search .................................. 257/508, 510, 257/506, 501, 513; 438/439

(56) References Cited

U.S. PATENT DOCUMENTS

| | | |
|---|---|---|
| 4,986,879 | 1/1991 | Lee . |
| 5,372,950 | 12/1994 | Kim et al. . |
| 5,387,540 | 2/1995 | Poon et al. ............................ 438/433 |
| 5,399,520 | 3/1995 | Jang .............................. 148/DIG. 50 |
| 5,447,884 | 9/1995 | Fahey et al. .......................... 438/437 |
| 5,492,858 | 2/1996 | Bose et al. . |
| 5,675,173 | * 10/1997 | Kawai et al. .......................... 257/508 |
| 5,798,553 | * 8/1998 | Furukawa et al. .................... 257/394 |
| 5,811,347 | 9/1998 | Gardner et al. . |
| 5,821,153 | * 10/1998 | Tsai et al. ............................. 438/439 |
| 5,945,724 | * 8/1999 | Parekh et al. ......................... 257/510 |
| 5,990,536 | * 11/1999 | Lau et al. .............................. 257/510 |
| 6,020,621 | * 2/2000 | Wu ....................................... 257/506 |

FOREIGN PATENT DOCUMENTS

| | | |
|---|---|---|
| 0 624 899 | 11/1994 | (EP) . |
| 0 764 981 | 3/1997 | (EP) . |
| 0017145 | * 1/1982 | (JP) ..................................... 257/510 |
| 364055853 | * 3/1989 | (JP) ..................................... 257/510 |
| 97/41596 | 11/1997 | (WO) . |

OTHER PUBLICATIONS

Wolf, Stanley, Ph.D., *Silicon Processing for the VLSI Era, vol. 3: The Submicron Mosfet,* 1995 by Lattice Press, pp. 555–568.

Severi, M. et al., "Process Dependence of Hole Trapping in Thin Nitrided $SiO_2$ Films," IEEE Transactions on Electron Devices, vol. 36, No. 11, Nov. 1, 1989, pp. 2447–2451.

Lo et al., "The Use of Ultrathin Reoxidized Nitrided Gate Oxide for Suppression of Boron Penetration in $FB_2^{+-}$Implanted Polysilicon Gated p–MOSFET's," IEEE Electron Device Letters, vol. 12, No. 4, Apr. 1991, pp. 175–177.

Hwang et al., "Electrical characteristics of reoxidized–nitrided chemical vapor deposited oxides," Appl. Phys. Lett., vol. 55, No.8, Aug. 1989, pp. 755–756.

International Search Report, Application No. PCT/US99–14587, mailed Oct. 28, 1999.

* cited by examiner

Primary Examiner—Mahshid Saadat
Assistant Examiner—Edgardo Ortiz
(74) Attorney, Agent, or Firm—Kevin L. Daffer; Conley, Rose & Tayon

(57) ABSTRACT

A method for fabricating an integrated circuit is presented wherein a trench is patterned in a field region of a semiconductor substrate. The trench is defined within the semiconductor substrate by a trench floor and trench sidewalls. A liner that primarily comprises nitride is formed upon the trench floor and sidewalls. The liner is then oxidized. A trench dielectric may be formed within the trench and planarized to complete the isolation structure.

16 Claims, 4 Drawing Sheets

SEMICONDUCTOR TOPOGRAPHY EMPLOYING A NITROGENATED SHALLOW TRENCH ISOLATION STRUCTURE

BACKGROUND OF THE INVENTION

1. Field of the Invention

This invention relates to semiconductor processing and, more particularly, to a method for forming an integrated circuit containing an improved isolation structure.

2. Description of the Related Art

The fabrication of an integrated circuit involves the formation of numerous devices within active areas of a semiconductor substrate. Isolation structures are needed to electrically isolate one device from another. Isolation structures define the field regions of the semiconductor substrate, and the device areas define the active regions. The devices may be interconnected with conducting lines running over the isolation structures.

A popular isolation technology used in the fabrication of integrated circuits involves locally oxidizing silicon. In local oxidation of silicon ("LOCOS") processes, an oxide layer is first grown upon a silicon substrate. A silicon nitride ("nitride") layer is deposited upon the oxide layer. The oxide layer serves as a pad layer for a nitride layer. The surface of a field region of the silicon substrate is then exposed by etching portions of the nitride layer and oxide layer above this region. Active regions of the silicon substrate remain covered by the nitride layer, which is used as a mask to prevent oxidation of these regions in subsequent steps. An implant is performed in the field region to create a channel-stop doping layer. The exposed portion of the silicon substrate within the field region is then oxidized. The silicon dioxide ("oxide") grown in the field region is termed field oxide. By growing a thick field oxide in isolation (or field) regions pre-implanted with a channel-stop dopant, LOCOS processing can help to prevent the establishment of parasitic channels in the field regions.

Although LOCOS has remained a popular isolation technology, the basic LOCOS process described above has several problems. When growing the field oxide, oxide growth should ideally be contained within the field region. In reality, however, some oxide growth may occur in a lateral direction, causing the field oxide to grow under and lift the edges of the nitride layer. Because the shape of the field oxide at the nitride edges is that of a slowly tapering wedge that merges into the pad oxide, the wedge is often described a bird's beak. In many instances, formation of the bird's beak can cause unacceptable encroachment of the field oxide into the active regions. In addition, the high temperatures associated with field oxide growth often cause the pre-implanted channel-stop dopant to migrate towards adjacent active regions. An increase in the dopant concentration near the edges of the field oxide can create a reduction in the drain current, an outcome that is often described as the narrow-width effect. Furthermore, thermal oxide growth is significantly less in small field regions (i.e., field areas of narrow lateral dimension) than in large field regions. Because of this reduction in oxide growth, an undesirable phenomenon known as the field-oxide-thinning effect may occur in small field regions. Field-oxide-thinning can produces problems with respect to field threshold voltages, interconnect-to-substrate capacitance, and field-edge leakage in small field regions between closely spaced active areas.

Despite advances made to decrease the bird's beak, channel-stop encroachment and non-planarity problems, it appears that LOCOS technology is still inadequate for deep submicron technologies. Many of the problems associated with LOCOS technology are alleviated by an isolation technique known as shallow trench isolation ("STI").

An isolation structure formed by a conventional shallow trench isolation process (hereinafter "the conventional STI process") is shown in FIG. 1. Silicon substrate 100 is typically a lightly doped wafer of single crystal silicon. The conventional STI process includes an initial step in which a relatively shallow trench (e.g., between 0.3 and 0.5 microns in depth) is etched in silicon substrate 100. The trench is then filled with trench dielectric 102, which is usually a deposited oxide. Some trench processes also include an intermediate step of growing oxide on the trench floor and sidewalls before filling the trench with trench dielectric 102. After the trench is filled, the upper surface of trench dielectric 102 is then made coplanar with the upper surface of silicon substrate 100 to complete the isolation structure.

The conventional STI process eliminates many of the problems of LOCOS techniques, including bird's beak and channel-stop dopant redistribution. STI processes are also better suited than LOCOS processes for isolating densely spaced active devices having field regions less than one $\mu$m wide. In addition, the trench isolation structure formed in STI processes is fully recessed, offering at least the potential for a planar surface. Moreover, field-oxide thinning in narrow isolation spaces is less likely to occur when using the shallow trench process. But despite its many advantages over LOCOS techniques, the conventional trench isolation process described above nevertheless has its own set of drawbacks.

One problem common to isolation structures, including those formed by the conventional STI process, is the unwanted diffusion of foreign species into the trench dielectric. For example, dopants implanted into active areas within semiconductor substrate 100 and adjacent to the trench can migrate into trench dielectric 102 during heat processing steps. Because of the fast diffusion rate of boron through silicon, boron diffusion into trench dielectrics is particularly widespread. Unfortunately, the voltage required to cause dielectric breakdown of a STI isolation structure generally decreases as the dopant density within the isolation structure increases. Consequently, when a voltage is applied across a conductor arranged horizontally above the trench isolation structure, dielectric breakdown may occur in those areas of the isolation structure having a high dopant density.

Another drawback of the conventional STI process results from the formation of sharp upper corners 106 near the surface of semiconductor substrate 100. Sharp corners are those defined by a sidewall surface (or perimeter) of the trench near the top of the trench that are substantially perpendicular to the substrate upper surface. Sharp upper corners 106 are typically a result of the highly directional etch used to form the trench.

Sharp upper corners 106 may introduce certain undesirable effects during subsequent processing steps that can influence an integrated circuit's operation. One problem that results from sharp upper corners 106 is the production of structural stresses in the crystal structure of substrate 102 when subsequent layers are deposited over and into a previously defined trench. The structural stresses are caused by stress mismatches between the substrate bulk material (a single crystal lattice) near the edge of the active area and the overlying dielectric or conductive layers placed proximate to the active area edge or periphery. Any stress within the lattice may cause a number of dislocations in the silicon crystal near and around upper corners 106. These dislocations usually migrate deeper into lower portions of the substrate during subsequent thermal processing steps (e.g., annealing). As these dislocations migrate away from sharp upper corners 106, the dislocations may form convenient paths for leakage currents. Consequently, the dislocations may provide an electrical conduction bridge that allows currents flowing through one device to "leak" into a neighboring device.

In further processing, a dielectric layer 110 is typically deposited over the planarized surface. As shown, a conductive pattern 108 may be deposited and patterned over dielectric layer 110. Conductive pattern 108 may be a metal line used as an electrical interconnection between devices, or alternatively, a polysilicon line used in transistor gates. Sharp upper corners 106 tend to congregate the electric fields in dielectric layer 110, which causes bunching of electric fields in the corner area. Because of this bunching of the electric field, the corner has a lower threshold voltage ($V_T$) than the planar surfaces adjacent the trench corner. Consequently, transistor performance will suffer since the transistor will experience a threshold gradient from the center of the channel to the edge of the channel where the electric fields are bunched. Furthermore, the bunching of electric fields at underlying sharp corners 106 has been found to adversely impact the integrity of dielectric layer 110. Reduction in the integrity of dielectric layer 110 may cause the layer to breakdown at lower voltages or suffer long-term reliability problems.

The conventional STI process also includes a step in which trench dielectric 104 is planarized (this step is done before the formation of dielectric layer 106). After the planarization step, the upper surface of the trench dielectric is somewhat coplanar with the upper surface of semiconductor substrate 100. Unfortunately, subsequent processing steps may lead to the upper surface of trench dielectric 104 being displaced significantly below the surface of semiconductor substrate 100. Recession of the upper surface of trench dielectric 104 below the surface of silicon substrate 100 can further bunch the electric fields near sharp upper corners 106, making the reduction in isolation voltage that occurs at the corners even greater.

Other problems can result from recession of the upper surface of trench dielectric 104 below the surface of silicon substrate 100. For example, chemical-mechanical polishing ("CMP") is often used to planarize the trench dielectric. CMP is usually described as a "dirty" procedure because of the polishing-slurry particles and other residues that accumulate upon the surface of the semiconductor topography during the process. These contaminants must be cleaned from the semiconductor topography after the CMP process is complete. The RCA cleaning method commonly used to clean such contaminants also removes the upper surface of the trench dielectric to a slightly greater degree than the adjacent silicon within semiconductor substrate 100. In addition, steps that involve the etching of oxide layers may result in the recession of the upper surface of trench dielectric 104 below the upper surface of semiconductor substrate 100. Examples of such steps include stripping the sacrificial oxide layer commonly grown upon the silicon substrate before deposition of the gate oxide and etching an oxide layer deposited over a gate electrode to form sidewall spacers.

In addition to the issues discussed above, recession of the upper surface of trench dielectric 104 below the surface of semiconductor substrate 100 may also cause problems during silicide formation. After dopants have been implanted into source/drain junctions of the active regions between the gate conductor and adjacent trench dielectric structures, highly conductive ohmic contacts must be formed between the source/drain junctions and overlying interconnect. A self-aligned silicide ("salicide") is typically formed at the juncture between the ohmic contacts and the junctions. Salicide formation involves deposition of a refractory metal across the semiconductor topography followed by heating the refractory metal such that the metal reacts with the underlying silicon. Thus, a highly conductive silicide is formed upon the junctions.

If a trench dielectric is recessed below adjacent source/drain junctions such that sidewalls of the silicon substrate are exposed, silicide formation may also occur upon those exposed sidewalls. Unfortunately, the relatively low resistivity silicide can form a conductive pathway between the source/drain junctions and the oppositely-doped underlying silicon substrate. The presence of the conductive pathway may cause majority charge carriers to be drawn away from rather than toward the channel region of the transistor during operation. This shorting of the source-to-drain current flow can lead to inoperability of the transistor.

Therefore, it would be desirable to design a method for forming an isolation structure that substantially prevents the migration of dopants from adjacent active regions. It would also be beneficial to contrive a method that reduces the negative effects of sharp corners where the trench sidewall meets the silicon substrate upper surface. Furthermore, it would be advantageous to create an isolation structure that is more resistant to becoming recessed below the silicon surface. The desired isolation structure would thus have increased reliability benefits over conventional isolation structures.

SUMMARY OF THE INVENTION

The problems described above are in large part addressed by the improved isolation structure and fabrication method presented herein. Broadly speaking, a method is provided for forming an integrated circuit having a trench patterned in a field region of a semiconductor substrate. The trench is defined within the semiconductor substrate by a trench floor and trench sidewalls. A liner that primarily comprises nitride is formed upon the trench floor and sidewalls. The liner is then oxidized.

According to one embodiment, patterning the trench includes the steps of forming a pad layer upon the semiconductor substrate and then forming a masking layer upon the pad layer. A window may then be etched in the masking layer and the pad layer that substantially defines the lateral dimensions of the trench. A dielectric fill material is preferably deposited in the trench, and may overflow the trench such that the upper surface of the dielectric fill material is above the upper surface of the masking layer. The dielectric fill material may then be planarized to form a trench dielectric having an upper surface that is substantially coplanar with the upper surface of the masking layer.

After planarization of the dielectric fill material, the masking layer and the pad layer are removed. In addition to forming upon the trench floor and sidewalls, the liner also preferably forms on the exposed sidewall portions of the pad layer. Consequently, an upper surface of the liner may extend above the surface of the semiconductor substrate. Because the upper surface of the trench dielectric is planarized to be substantially coplanar with an upper surface of the masking layer, the upper surface of the trench dielectric may also extend above the surface of the semiconductor substrate. After removal of the masking and pad layers, the liner and trench dielectric may be planarized such that their upper surfaces are substantially coplanar. Preferably, however, the upper surface of the trench dielectric and the upper surface of the liner are not planarized, but are instead maintained above the surface of the semiconductor substrate while active devices are formed in adjacent active regions. As such, the likelihood of the isolation structure (i.e., the combination of the liner and the trench dielectric) becoming entirely recessed below the surface is greatly reduced. Moreover, it is believed that maintaining portions of the isolation structure above the surface of the semiconductor substrate results in a significant reduction of the edge effects discussed above (e.g., electric field bunching) compared to an isolation structure that is recessed below the semiconductor surface.

The liner is preferably formed upon the trench floor and sidewalls by annealing the semiconductor substrate in a nitrogen-containing ambient. The nitrogen-containing ambient may be composed of about 60–80% $NH_3$. The balance of the nitrogen-containing ambient is preferably $N_2$, which may be replaced by an inert gas if a slower reaction is desired. The nitrogen-containing ambient is preferably substantially free of oxygen.

When $NH_3$ is used to nitridate silicon, hydrogen-containing species (e.g., $NH_x$, —H, and —OH) are usually formed. The presence of these species can result in the formation of electron traps between the liner and the subsequently deposited trench dielectric. Oxidation of the liner reduces the concentration of hydrogen-containing species within the liner, and thus the potential for electron traps. Oxidation of the liner is preferably carried out by annealing the semiconductor substrate in an oxygen-containing ambient.

Furthermore, it is desirable that the nitrogen concentration at the liner-trench dielectric interface be reduced below the level present after the initial nitridation. Oxidation of the liner preferably creates a nitrogen gradient within the liner that is oriented such that the percentage of nitrogen atoms within the liner decreases in a direction away from the trench floor and sidewalls. In one embodiment, the percentage of the nitrogen atoms in the portions of the liner closest to the trench floor and sidewalls is about 5–7%, and the percentage of nitrogen atoms in those portions of the liner most distant from the trench floor and sidewalls is about 3–5%. Thus, oxidation of the liner allows the percentage of nitrogen at the liner-trench dielectric interface to be reduced to a suitable level while keeping the percentage of nitrogen at the liner-trench interface high enough to substantially prevent dopant migration.

In another embodiment, the pad layer is composed of oxide, and the masking layer is composed of nitride. Annealing the semiconductor substrate in a nitrogen-containing ambient preferably not only forms the liner on the trench floor and sidewalls, but also forms the liner on the exposed sidewall portions of the pad layer (as stated above). Because the masking layer is composed of nitride, the liner preferably does not form on its exposed sidewall portions. Thus, the liner covers the sharp upper corners formed at the interface between the trench sidewalls and the upper surface of the semiconductor substrate. Forming the liner in such a manner may reduce the stress mismatches between the semiconductor substrate and the overlying pad layer, thus decreasing the likelihood of dislocations being formed. The formation of the liner may also reduce the sharpness of the corners, which could lessen the bunching of electric fields that would occur if the upper corners were very sharp.

A semiconductor topography is also presented. The semiconductor topography contains a trench disposed within a field region of a semiconductor substrate. The trench is preferably defined in an upper portion of the semiconductor substrate by a trench floor and trench sidewalls. A liner may be arranged upon the trench floor and trench sidewalls. The liner comprises nitrogen and oxygen atoms. A nitrogen gradient exists within the liner, the nitrogen gradient being oriented such that a percentage of nitrogen within the liner increases in a direction away from the trench floor and sidewalls. A trench dielectric may be at least partially disposed within the trench. Active devices, such as MOS transistors, may be arranged in adjacent active regions. The nitrogen gradient is preferably oriented such that the liner comprises about 5–7 percent nitrogen atoms in those portions of the liner nearest to the trench floor and sidewalls and about 3–5 percent nitrogen atoms in those portions of the liner most distant from the trench floor and sidewalls. The final isolation structure (i.e., the combination of the liner and the trench dielectric) exhibits increased reliability over conventional isolation structures.

BRIEF DESCRIPTION OF THE DRAWINGS

Other objects and advantages of the invention will become apparent upon reading the following detailed description and upon reference to the accompanying drawings in which.

Figure 1:
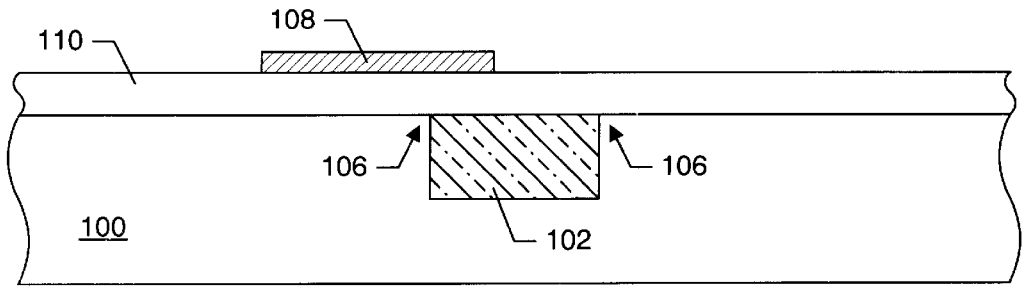
FIG. 1 is a cross-sectional view of a conventional STI structure disposed within a silicon substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
FIG. 2 is a partial cross-sectional view of a semiconductor topography in accordance with the present invention.

Referring now to the drawings, FIGS. 2–12 illustrate a process sequence for forming an isolation structure within a field region of a semiconductor substrate. FIG. 2 shows a partial cross-sectional view of semiconductor substrate 100. Semiconductor substrate 100 is preferably a wafer of single crystal silicon.

Figure 3:
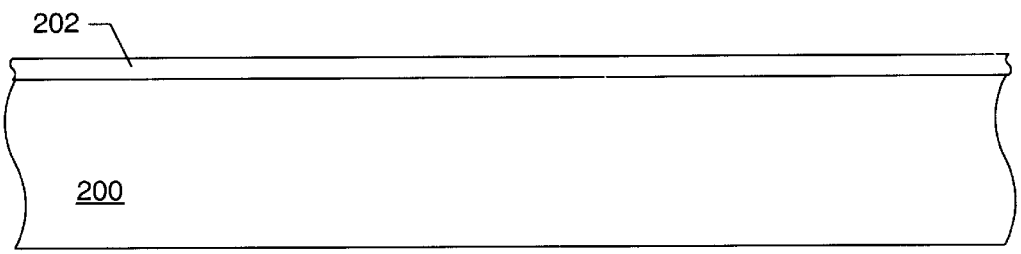
FIG. 3 is a partial cross-sectional view of the semiconductor topography, wherein a pad layer is formed upon the semiconductor substrate according to an initial processing step subsequent to FIG. 2.

FIG. 3 depicts the formation of pad layer 202 upon semiconductor substrate 200. Pad layer 202 preferably is preferably composed of oxide, and is either deposited or grown in a heated, oxygen-containing ambient. The thickness of pad layer 202 is preferably about 50–200 angstroms.

Figure 4:
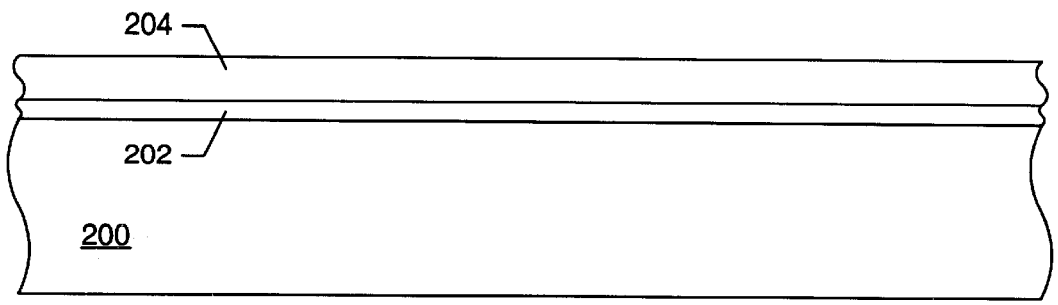
FIG. 4 is a partial cross-sectional view of the semiconductor topography, wherein a masking layer is formed upon the pad layer according to a processing step subsequent to FIG. 3.

FIG. 4 shows the formation of masking layer 204 upon pad layer 202. Masking layer 204 is preferably composed of a material that is substantially resistant to oxidation and substantially impervious to the diffusion of oxidants into any underlying materials. Suitable materials for masking layer 204 include nitride. Nitride may be deposited to form masking layer 204 by a variety of CVD methods, including low-pressure, plasma-enhanced, and remote plasma-enhanced techniques. Masking layer 204 is preferably about 500–1800 angstroms thick. If masking layer 204 is made of nitride, a pad layer 202 made of oxide can reduce the stresses that inherently exist between deposited nitride (in this case, masking layer 204) and single crystal silicon (semiconductor substrate 200).

Figure 5:
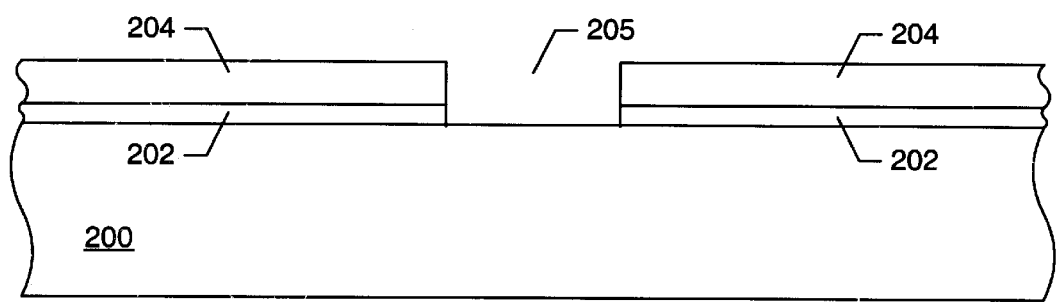
FIG. 5 is a partial cross-sectional view of the semiconductor topography, wherein a window is patterned in the masking layer and the pad layer according to a processing step subsequent to FIG. 4.

FIG. 5 depicts a subsequent processing step in which masking layer 204 and pad layer 202 are patterned to form window 205. Formation of window 205 preferably occurs by use of a dry etch process with a high degree of anisotropy. As such, the sidewalls of masking layer 204 and pad layer 202 exposed by the formation of window 205 are preferably vertical. Photoresist (not shown) may be spun on, exposed, and developed as is well known in the art to define the pattern used to form window 205.

Figure 6:
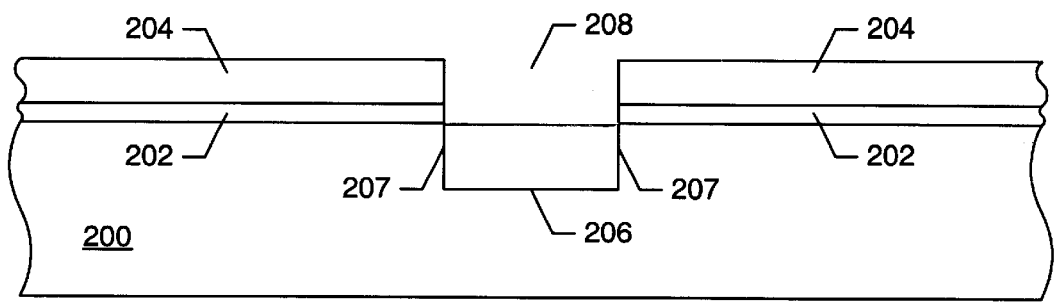
FIG. 6 is a partial cross-sectional view of the semiconductor topography, wherein a trench is patterned in the semiconductor substrate according to a processing step subsequent to FIG. 5.

FIG. 6 depicts a subsequent processing step in which trench 208 is patterned within a field region of semiconductor substrate 200. The trench is preferably defined within an upper portion of semiconductor substrate 200 by trench floor 206 and trench sidewalls 207. Trench 208 is preferably formed by removal of portions of semiconductor substrate 200 in a highly anisotropic dry etch process. The lateral dimensions (i.e., length and width) of trench 208 may be substantially defined by the corresponding lateral dimensions of window 205. The width of trench 208 may be as narrow as the minimum resolvable feature size of the process used to form the trench. In a preferred embodiment, trench 208 is about 0.20 microns wide. Trench 208 is preferably about 0.15–0.30 microns deep.

Although trench sidewalls 207 are shown as being substantially perpendicular to trench floor 206 (thus forming sharp corners at the intersections), it should be understood that the particular relationship shown is not fixed. On the contrary, the bottom corners of the trench may be substantially rounded, the angle between trench sidewalls 207 and trench floor 206 may deviate a large degree from vertical, or any number of other modifications may be made that would be apparent to one skilled in the art having the benefit of this disclosure.

Figure 7:
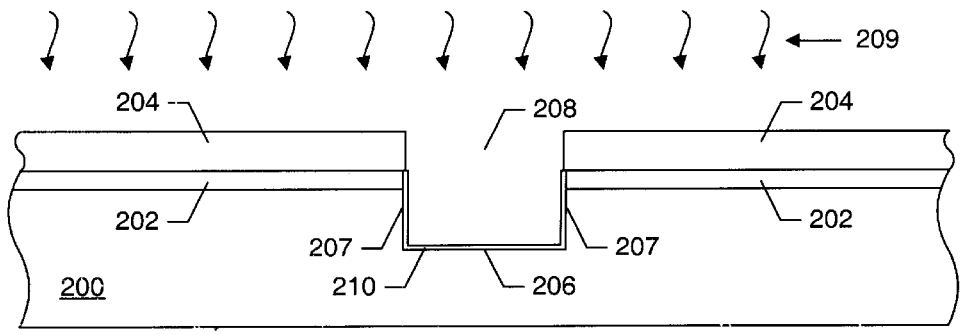
FIG. 7 is a partial cross-sectional view of the semiconductor topography, wherein a liner primarily composed of nitride is formed upon the floor and sidewalls of the trench according to a processing step subsequent to FIG. 6.

FIG. 7 illustrates an annealing process in which semiconductor substrate 200 is exposed to thermal radiation 209 in a nitrogen-containing ambient. The nitrogen within the ambient may be in the form of $NH_3$ and/or $N_2$. In a preferred embodiment, the nitrogen-containing ambient comprises from about 60–80% $NH_3$, with the balance being $N_2$. The $N_2$ may be replaced with an inert gas such as helium or argon at later stages of the nitridation step to slow the nitridation reaction. Preferably, annealing takes place in a rapid thermal processing chamber ("RTP") for about 30–120 seconds at a temperature of about 900–1100° C. Annealing of semiconductor substrate 200 preferably nitridates trench floor 206 and trench sidewalls 207 such that liner 210 is formed. Preferably, liner 210 is primarily composed of nitride. Liner 210 may also form on the exposed sidewalls of pad layer 202 (as shown in FIG. 7). Because pad layer 202 is about 50–200 angstroms thick, the upper surface of liner 210 preferably extends about 50–200 angstroms above the surface of semiconductor substrate 200. Liner 210 is preferably about 50–100 angstroms thick at this point in the process.

Figure 8:
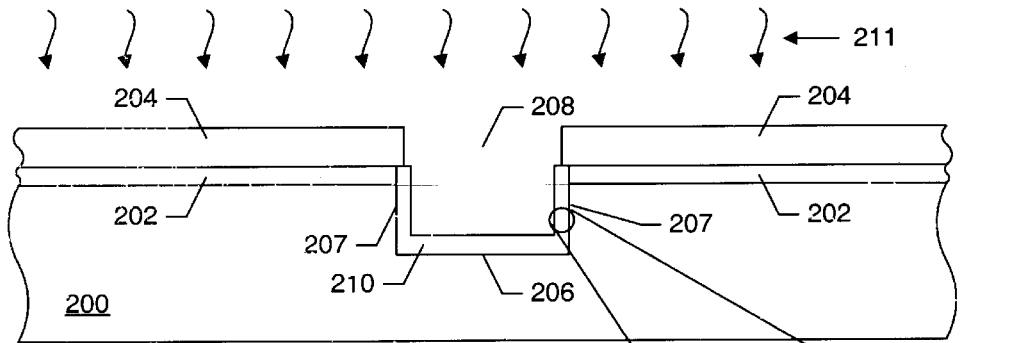
FIG. 8 is a partial cross-sectional view of the semiconductor topography, wherein a the liner is oxidized according to a processing step subsequent to FIG. 7.
Figure 8A:
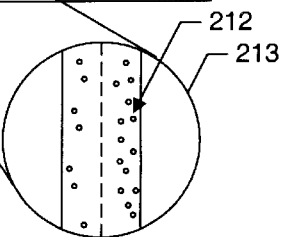
FIG. 8a is a detailed view of a section of the liner showing relative atomic concentrations of nitrogen within portions of the liner.

FIG. 8 depicts a subsequent annealing step in which semiconductor substrate 200 is exposed to thermal radiation 211 in an oxygen-containing ambient. Annealing preferably takes place in an RTP chamber at temperatures of about 1000–1100° C. for 1 to 3 minutes. Alternately, annealing may be carried out in a tube furnace at temperatures of about 1000–1100° C. for 15–30 minutes. Annealing preferably oxidizes liner 210 such that a nitrogen gradient is created. FIG. 8a shows detailed section 213 of liner 210. As can be seen in this figure, the nitrogen gradient is preferably oriented such that the percentage of nitrogen atoms 212 within liner 210 is higher in the portions of liner 210 closest to trench floor 206 and trench sidewalls 207 than in the portions of liner 210 most distant from trench floor 206 and trench sidewalls 207. For example, the portions of liner 210 closest to trench floor 206 and trench sidewalls 207 may have about 5–7 percent nitrogen atoms, while the portions of liner 210 most distant from trench floor 206 and trench sidewalls 207 may have about 3–5 percent nitrogen atoms. The oxidation of liner 210 also preferably increases the thickness of liner 210 to about 100–300 angstroms. The oxygen-containing ambient may also comprise an inert gas to moderate the rate of oxidation during the annealing process.

Figure 9:
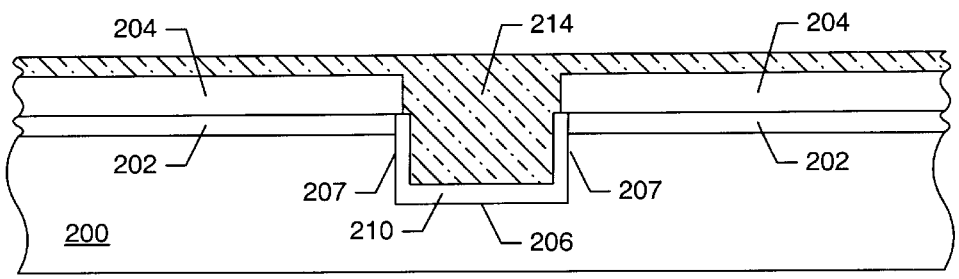
FIG. 9 is a partial cross-sectional view of the semiconductor topography, wherein a dielectric fill material is deposited within the trench according to a processing step subsequent to FIG. 8.
Figure 10:
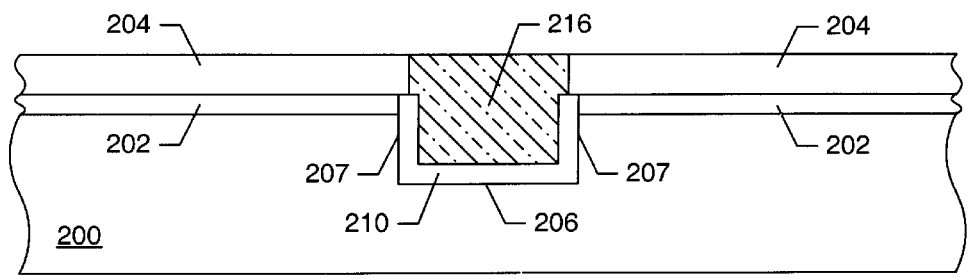
FIG. 10 is a partial cross-sectional view of the semiconductor topography, wherein the dielectric fill material is planarized to form a trench dielectric according to a processing step subsequent to FIG. 9.

FIG. 9 depicts a subsequent processing step in which dielectric fill material 214 is deposited in trench 210 such that an upper surface of the dielectric fill material 214 is above an upper surface of the masking layer 204. Dielectric fill material 214 may be composed of oxide or silicon oxynitride ("oxynitride") deposited in a CVD process.

Dielectric fill material 214 is then planarized to form trench dielectric 216. After planarization, the upper surface of trench dielectric 216 is preferably substantially coplanar with the upper surface of masking layer 204. Planarization of dielectric fill material 214 may be carried out by use of CMP or a selective etchback technique. If planarization of dielectric fill material 214 is carried out by CMP methods, masking layer 204 preferably serves as a polish stop. Because masking layer 205 is preferably about 500–1800 angstroms thick and the underlying pad layer is about 50–200 angstroms thick, the upper surface of trench dielectric 216 preferably extends about 550–2000 angstroms above the surface of semiconductor substrate 200.

Figure 11:
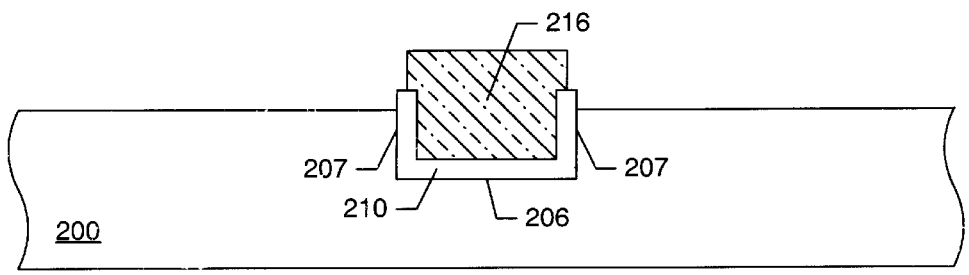
FIG. 11 is a partial cross-sectional view of the semiconductor topography, wherein the masking layer and pad layer are removed according to a processing step subsequent to FIG. 10.

FIG. 11 depicts a subsequent processing step in which masking layer 204 and pad layer 202 are removed. The removal of masking layer 204 may be accomplished by use of dry or wet etch processes. If masking layer 204 is composed of nitride, then a heated solution of phosphoric acid may be used to remove the layer. Pad layer 202 may also be removed by use of dry or wet etch processes. Regardless of the method used, removal of masking layer 204 and pad layer 202 is preferably undertaken such that minimal amounts of trench dielectric 216, liner 210, and semiconductor substrate 200 are removed.

Figure 12:
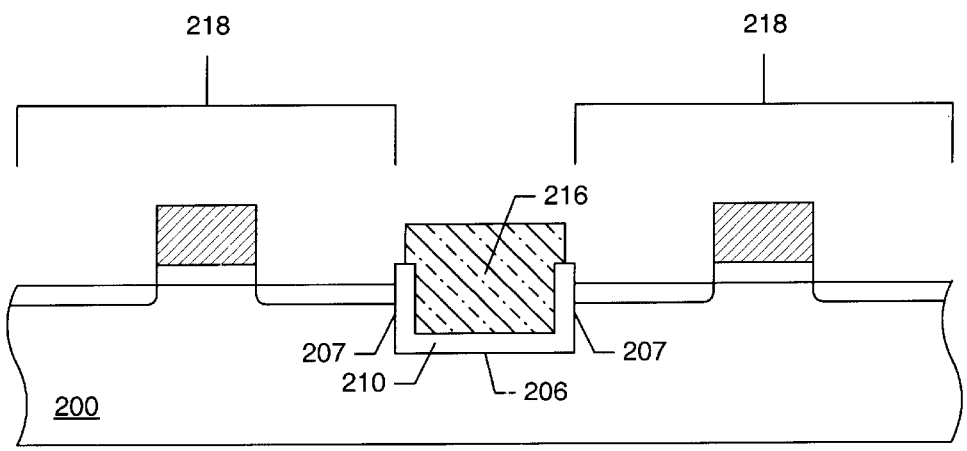
FIG. 12 is a partial cross-sectional view of the semiconductor topography, wherein MOS transistors are formed in the active regions adjacent to the trench according to a processing step subsequent to FIG. 11.

FIG. 12 depicts the formation of active devices, in this case MOS transistors 218, in the active areas adjacent to the isolation stricture defined by the liner and the trench dielectric while maintaining the upper surfaces of liner 210 and trench dielectric 216 above the upper surface of semiconductor substrate 200. Liner 210 and trench dielectric 216 may be planarized so that their upper surfaces are coplanar with the upper surface of semiconductor substrate 200. However, it is preferred that liner 210 and trench dielectric 216 not be planarized, but instead extend significantly above the surface of semiconductor substrate 200. As such, it is highly unlikely that these structures will be removed by subsequent processes to a point where their upper surfaces are recessed below semiconductor substrate 200 (unless, of course, removal of these structures is the desired goal of such processes).

It will be appreciated to those skilled in the art having the benefit of this disclosure that both the improved isolation structure and the method for making an improved isolation structure described herein are capable of being used with numerous applications involving active area isolation within integrated circuits. Further modifications and alternative embodiments of various aspects of the invention will be apparent to those skilled in the art in view of this description. For example, the present process could be incorporated into a modified LOCOS process where a field oxide is first grown that partially fills a trench formed in a semiconductor substrate. This step could be followed by nitridation of the trench to form a liner and a subsequent oxidation of the liner, as described herein. It is intended that the following claims be interpreted to embrace all such modifications and changes and, accordingly, the specification and drawings are to be regarded in an illustrative rather than a restrictive sense.

What is claimed is:

1. A semiconductor comprising:
   a trench disposed within a field region of a semiconductor substrate, wherein said trench is defined in an upper portion of said semiconductor substrate by a trench floor and trench sidewalls;
   a liner arranged upon said trench floor and trench sidewalls, wherein said liner comprises nitrogen and oxygen atoms, and wherein a nitrogen gradient exists within said liner, said nitrogen gradient being oriented such that a percentage of nitrogen atoms within said liner decreases in a direction away from said trench floor and said trench sidewalls, and wherein said percentage of nitrogen atoms within said liner is at least about 3 percent; and
   a trench dielectric at least partially disposed within said trench.

2. The semiconductor topography of claim 1, wherein said semiconductor substrate comprises active regions adjacent to said field region, and wherein active devices are arranged within said active regions, and wherein an upper surface of said liner and an upper surface of said trench dielectric are both disposed above an uppermost surface of said semiconductor substrate.

3. The semiconductor topography of claim 2, wherein said upper surface of said trench dielectric is disposed about 550–2000 angstroms above said uppermost surface of said semiconductor substrate, and wherein said upper surface of said liner is disposed about 50–200 angstroms above said uppermost surface of said semiconductor substrate.

4. The semiconductor topography of claim 1, wherein said nitrogen gradient is further oriented such that said liner comprises about 5–7 percent nitrogen atoms in those portions of said liner nearest to said trench floor and sidewalls and about 3–5 percent nitrogen atoms in those portions of said liner most distant from said trench floor and said trench sidewalls.

5. The semiconductor topography of claim 1, wherein said liner comprises a thickness of about 100–300 angstroms.

6. The semiconductor topography of claim 1, wherein said trench comprises a lateral width of about 0.20 microns.

7. The semiconductor topography of claim 1, wherein said trench comprises a vertical depth of about 0.15–0.30 microns.

8. The semiconductor topography of claim 1, wherein said trench sidewalls are substantially perpendicular to said trench floor.

9. The semiconductor topography of claim 1, wherein said trench dielectric comprises CVD oxide.

10. The semiconductor topography of claim 1, wherein said trench dielectric comprises CVD oxynitride.

11. The semiconductor topography of claim 4, wherein said liner further comprises substantially more oxygen than nitrogen atoms in those portions of said liner most distant from said trench floor and said sidewalls and substantially more nitrogen than oxygen atoms in those portions of said liner nearest to said trench floor and said sidewalls.

12. A semiconductor topography, comprising:
    a trench disposed within a field region of a semiconductor substrate, wherein said trench is defined in an upper portion of said semiconductor substrate by a trench floor and trench sidewalls;
    a liner arranged upon said trench floor and trench sidewalls, wherein said liner comprises nitrogen and oxygen atoms, and wherein a nitrogen gradient exists within said liner, said nitrogen gradient being oriented such that a percentage of nitrogen atoms within said liner decreases in a direction away from said trench floor and said trench sidewalls, and wherein an upper surface of said liner is disposed above an uppermost surface of said semiconductor substrate; and
    a trench dielectric at least partially disposed within said trench, wherein an upper surface of said trench dielectric is disposed above said uppermost surface of said semiconductor substrate.

13. The semiconductor topography of claim 12, wherein said upper surface of said trench dielectric is disposed about 550–2000 angstroms above said uppermost surface of said semiconductor substrate and wherein said upper surface of said liner is disposed about 50–200 angstroms above said uppermost surface of said semiconductor substrate.

14. The semiconductor topography of claim 12, wherein said liner further comprises substantially more oxygen than nitrogen atoms in those portions of said liner most distant from said trench floor and said sidewalls and substantially more nitrogen than oxygen atoms in those portions of said liner nearest to said trench floor and said sidewalls.

15. The semiconductor topography of claim 12, wherein said liner comprises a thickness of about 100–300 angstroms.

16. The semiconductor topography of claim 12, wherein said semiconductor substrate comprises active regions adjacent to said field region, and wherein active devices are arranged within said active regions.

* * * * *